United States Patent
Wu (10) Patent No.: US 6,277,711 B1
(45) Date of Patent: Aug. 21, 2001

(54) SEMICONDUCTOR MATRIX FORMATION

(76) Inventor: Jiahn-Chang Wu, No. 15, Lane 13, Alley 439, Her-Chiang Street, Chu-Tung, Hsinchu (TW)

(*) Notice: Subject to any disclaimer, the term of this patent is extended or adjusted under 35 U.S.C. 154(b) by 0 days.

(21) Appl. No.: 09/756,611

(22) Filed: Jan. 8, 2001

(51) Int. Cl.⁷ .......................... H01L 21/46; H01L 21/78; H01L 21/301
(52) U.S. Cl. .................. 438/464; 156/344; 156/584; 29/426.1; 29/426.4; 29/426.5; 29/426.6; 29/762; 438/460; 438/462
(58) Field of Search ...................... 438/469, 462, 438/464; 29/426.1, 426.4–426.6, 762; 156/344, 584

(56) References Cited

U.S. PATENT DOCUMENTS

| | | | |
|---|---|---|---|
| 3,714,704 | * 2/1973 | Moore | 29/569 |
| 3,918,150 | * 11/1975 | Gantley | 29/583 |
| 4,798,645 | * 1/1989 | Pak | 156/344 |
| 5,725,728 | * 3/1998 | Fuke et al. | 156/584 |

* cited by examiner

Primary Examiner—John F. Niebling
Assistant Examiner—David A. Zarneke
(74) Attorney, Agent, or Firm—Hung C. Lin (57) ABSTRACT

Semiconductor dice from a scribed wafer are first separated by a stretched cloth. The dice on the stretchable cloth are then lined up with a target unit and transferred by pressure to a target unit to form a matrix. The pressure can be exerted by pressing individually the dice from the stretchable cloth to the target unit. Alternatively, the dice from the stretchable cloth can first be transferred to a transfer unit before being compressed to the target unit. The transfer unit may also be a perforated board to the hold the dice in place before the dice are soldered to the target unit.

12 Claims, 15 Drawing Sheets

SEMICONDUCTOR MATRIX FORMATION

BACKGROUND OF THE INVENTION (1) Field of the Invention

This invention relates to semiconductor device packaging, particularly to a method of forming a semiconductor matrix from a scribed wafer. The matrix may be composed of optical devices such as light emitting diodes, laser diodes, photo diodes, etc., which can be diced into individual devices. The matrix may also be used as the target of an image sensor, display panel, etc without being diced. The technique may also be used for non-optical semiconductor devices.

(2) Brief Description of Related Art

Figure 1:
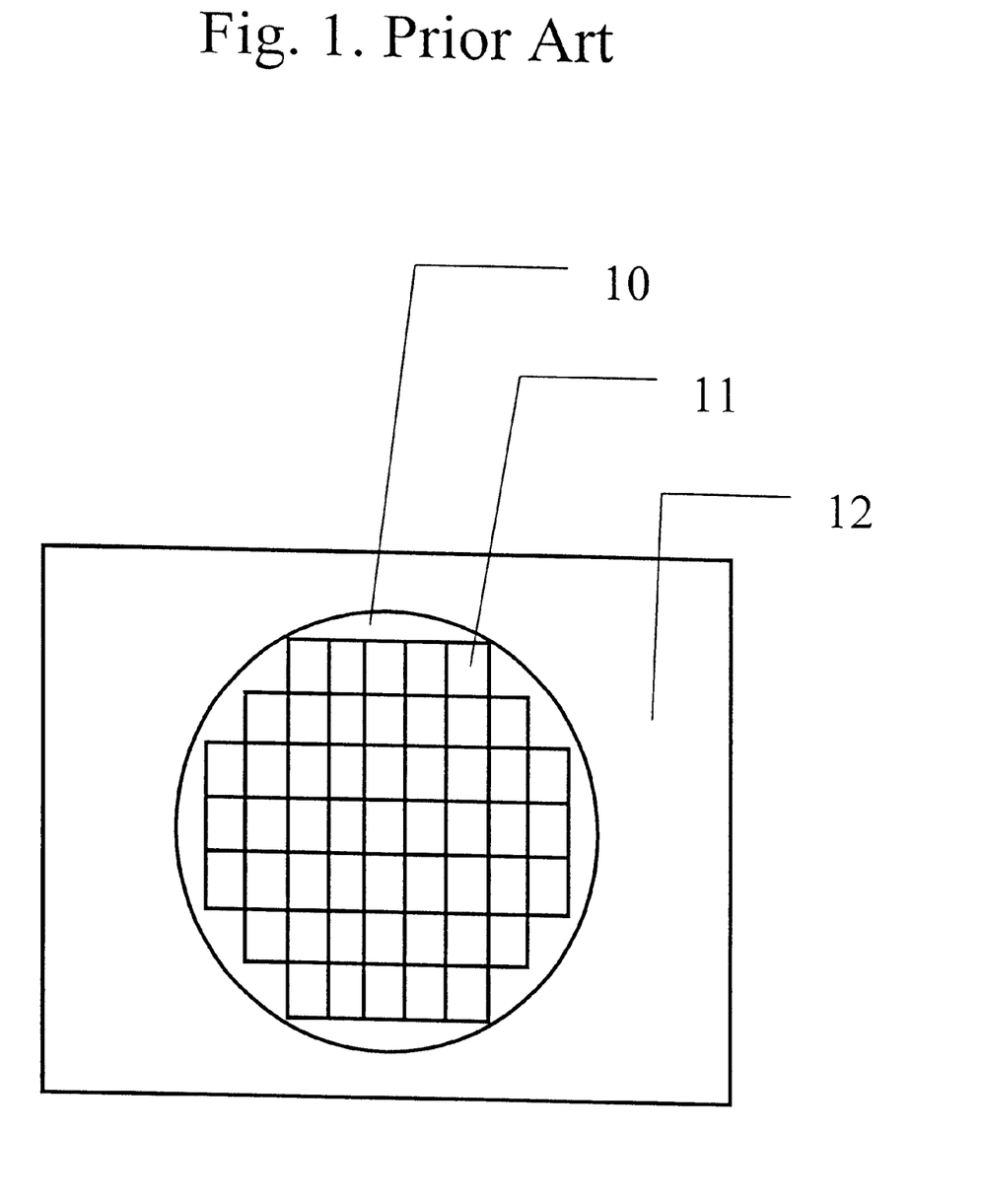
FIG. 1 shows a prior art scribed wafer glued to a stretchable cloth.
Figure 2:
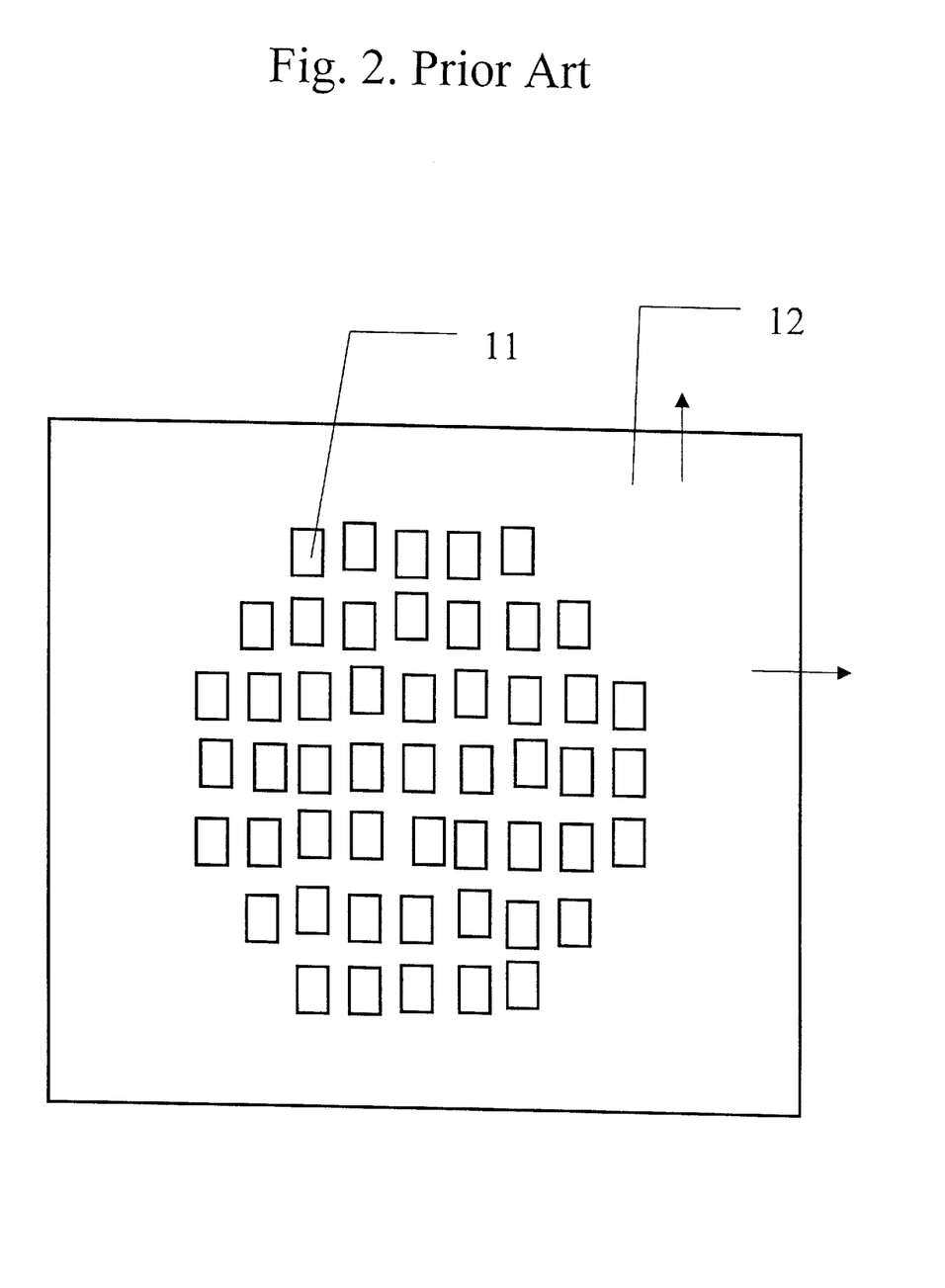
FIG. 2 shows separated dice over the stretchable cloth.
Figure 3:
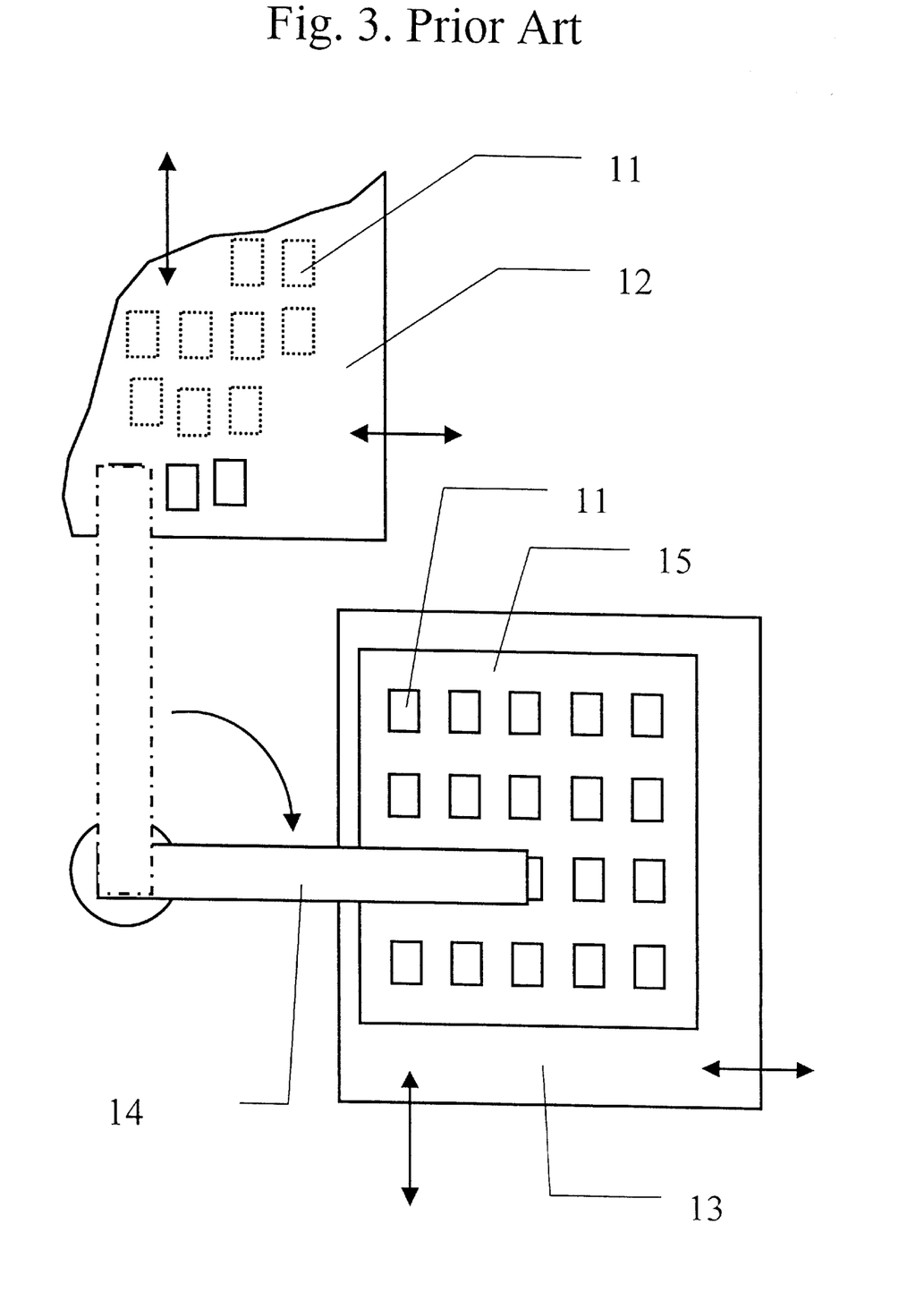
FIG. 3 shows the prior art mechanism to transfer the separated dice from the stretchable cloth to a target unit.
Figure 4:
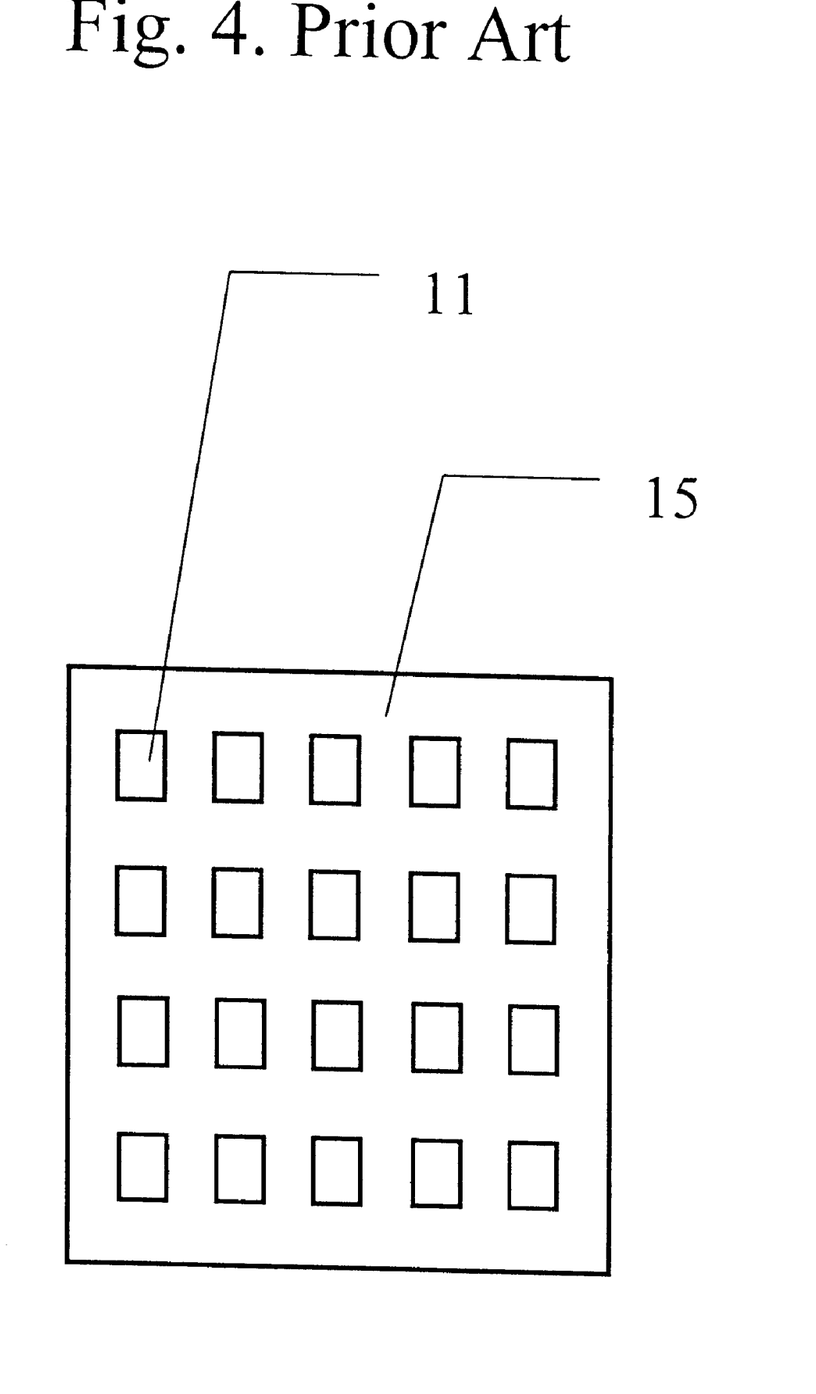
FIG. 4 shows a matrix of dice over the target unit.

FIGS. 1–5 show a prior art technique for dicing a semiconductor wafer into individual dice to be packaged as a semiconductor matrix. FIG. 1 shows a semiconductor wafer 10 mounted on a stretchable sticky cloth 12. The wafer 12 is scribed along horizontal and vertical lines to define the outlines of individual dice 11. Upon stretching the cloth 12 in the X-direction and the Y-direction as shown by the arrows in FIG. 2, the dice 11 are separated. The dice 11 on the stretchable cloth 12 are then transferred one by one to a target unit 15 as a regular matrix. The transfer is implemented by a movable arm 14. The arm first picks up by suction the dice 11 in its vertical position and then rotates to a horizontal position for delivering the picked-up dice to target unit 15. The target unit 15 is mounted on a movable table 13, which is digitally controlled to move the target table in two orthogonal directions (i.e. the X-direction and the Y-direction) so that the dice are released and lined up as a matrix. Meanwhile the stretchable cloth is sensed by a sensor (not shown) and is moved to pick up another die. FIG. 4 shows the completed matrix of dice 11 over a target unit 15. The foregoing mechanism requires two perpendicular motions and one roundtrip rotation of the arm 14 to complete a transfer, and is time consuming and not cost effective.

Figure 5:
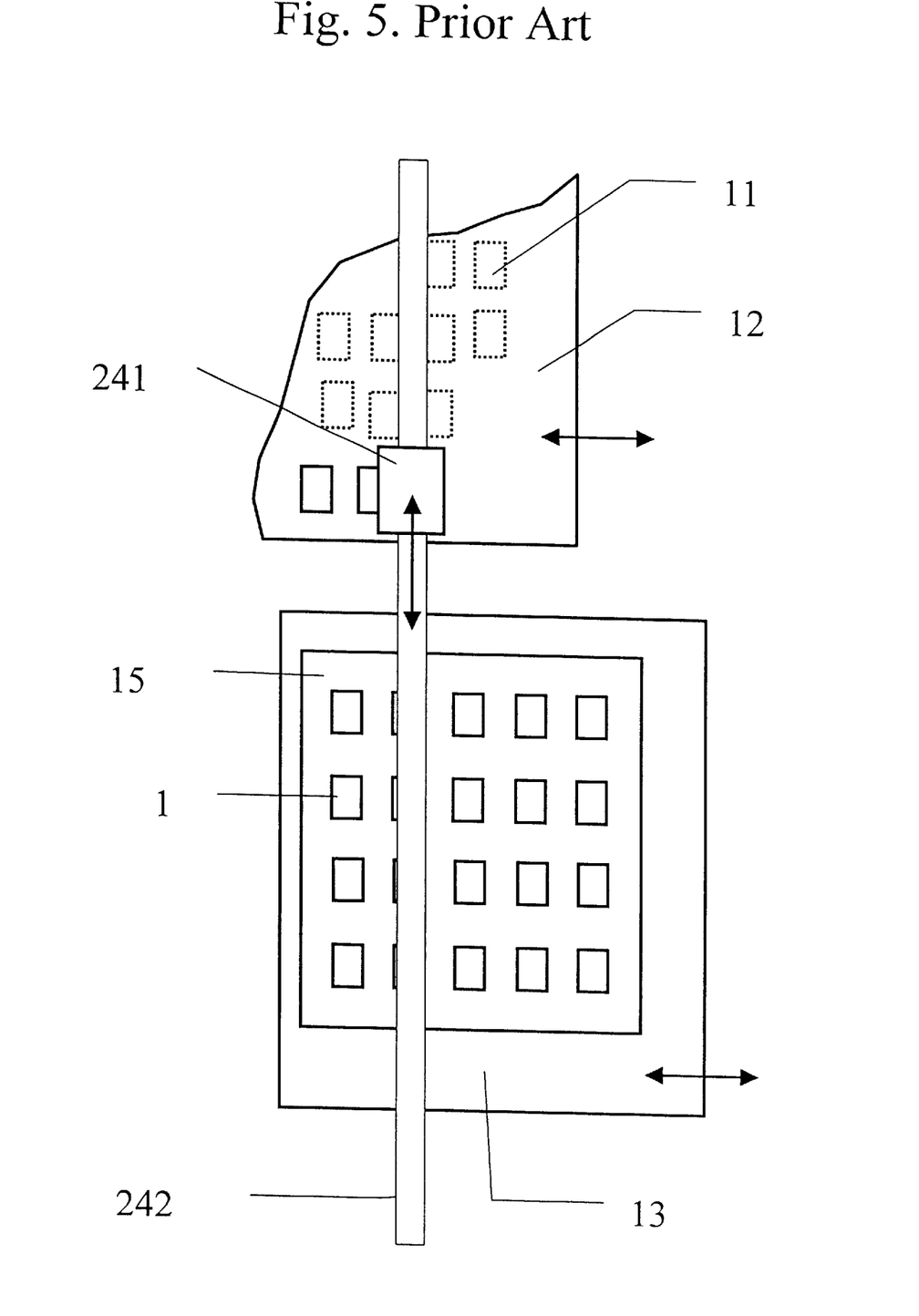
FIG. 5 shows a second embodiment of a prior art mechanism to transfer dice from a stretchable cloth to a target unit.

FIG. 5 shows another prior art embodiment. Instead of a swinging transfer arm 14 as shown in FIG. 3, the transfer mechanism is a suction head 241 sliding along a vertical rod 242. The dice 11 are separated on a stretchable cloth 12. The suction head 241 is moved vertically while the stretchable cloth is moved horizontally. When a die is sensed by a sensor (not shown), the suction head picks up the die and transfers the die vertically over a target unit 15 mounted on a table 13 which is movable in a horizontal direction (as shown by the horizontal arrowheads). The target unit 15 is digitally controlled so that the transferred dice 11 are lined up one by one in a matrix formation. After the die is delivered to the target unit 15, the pick-up arm returns the suction head 241 over the stretchable cloth 12 to pick up another die. This mechanism also requires two perpendicular motions and one roundtrip movement to get back to the starting point and is not cost-effective.

SUMMARY

An object of this invention is simplify the mechanism in transferring dice from the stretchable cloth to a target unit. Another object of this invention is to reduce the time of operation in transferring dice. Still another object of this invention is to reduce the cost of transferring dice from the stretchable cloth to the target unit.

These objects are achieved by lining up the dice from the stretchable cloth with the target unit and pressing the dice from the stretchable cloth to the target unit in a matrix formation. The pressing can be accomplished by stamping individually the dice from the stretchable cloth to the target unit. Alternatively, the dice from stretchable cloth can first be transferred to a transfer unit before being compressed to the target unit. The transfer unit may be a perforated plate to hold the dice in place before the dice are soldered to the target unit.

DETAILED DESCRIPTION OF THE INVENTION

Figure 6:
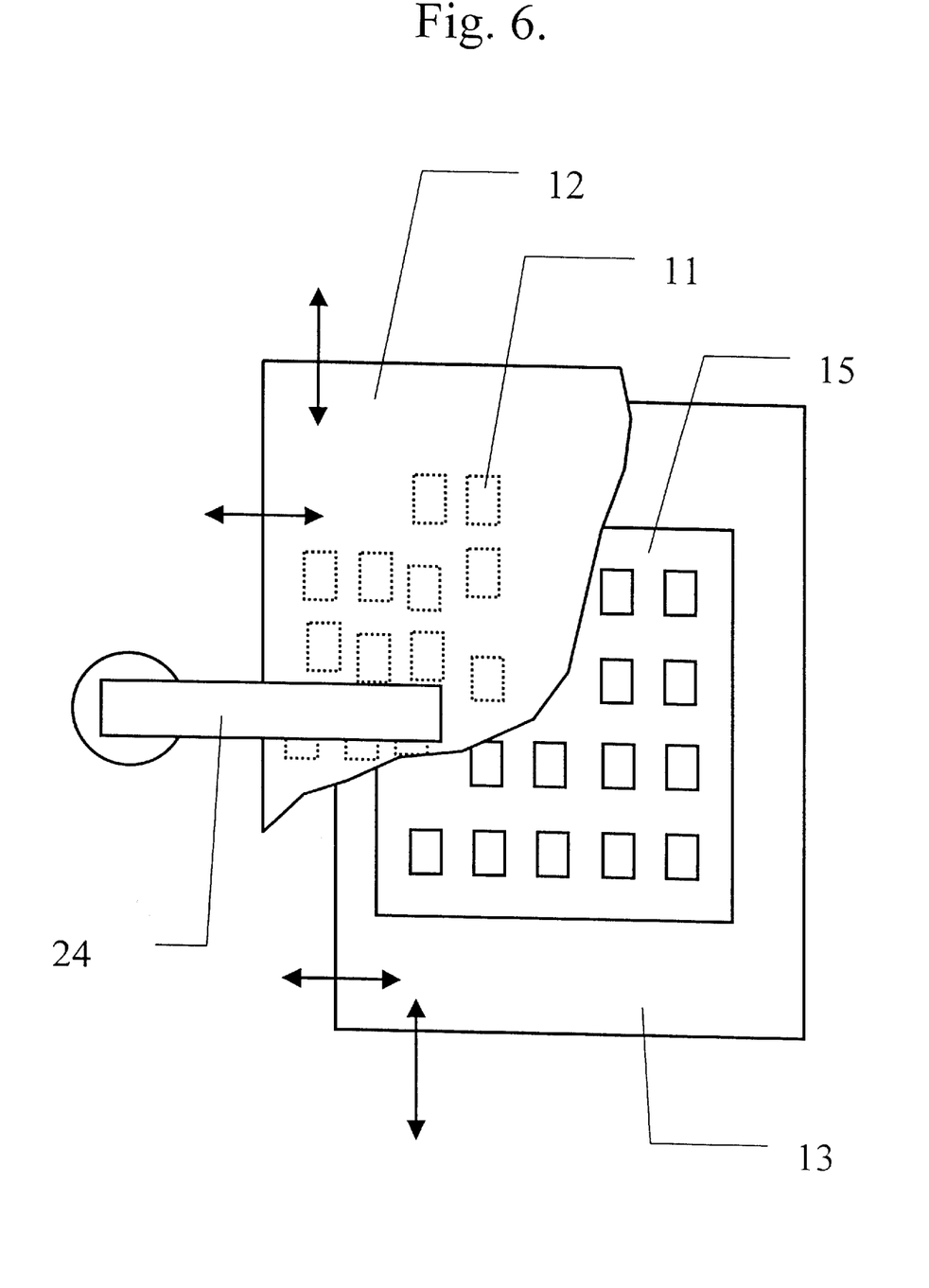
FIG. 6 shows a mechanism for transferring dice based on the present invention.
Figure 7:
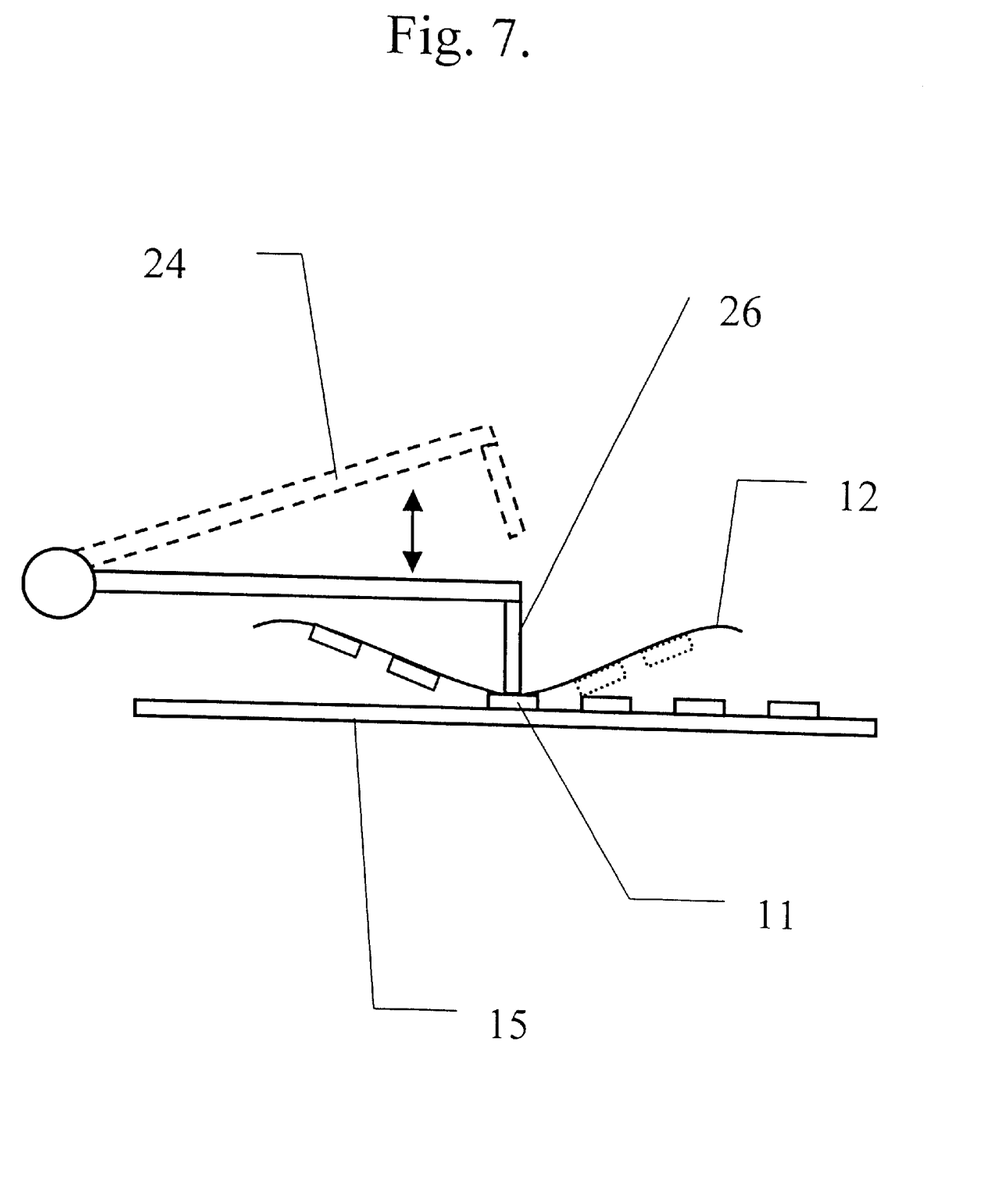
FIG. 7 shows the stamping motion for transferring the dice from the stretchable cloth to the target unit.

FIG. 6 shows the basic mechanism of the present invention. A stretchable cloth 12 similar to that shown in FIG. 3 is placed over a target unit 15, which is mounted on a table 13. Both the stretchable cloth 12 and the table 13 are capable of digitally controlled orthogonal X-direction and Y-direction movements as indicated by the arrowheads. A hammer 24 hangs over the stretchable cloth 12. The dice on the stretchable cloth face downward toward the target unit 15 as shown in FIG. 7. When the die in the stretchable cloth 12 is moved to a appropriate position to form a dice matrix, the hammer 24 is lowered to press the die on the stretchable cloth against the target unit. Then the die is attached to the target unit 15. Note that the hammer 24 does not require a two-dimensional motion as compared to prior art. An alternative is moving both the hammer 24 and the target unit while fixing the stretchable cloth 12.

Figure 8:
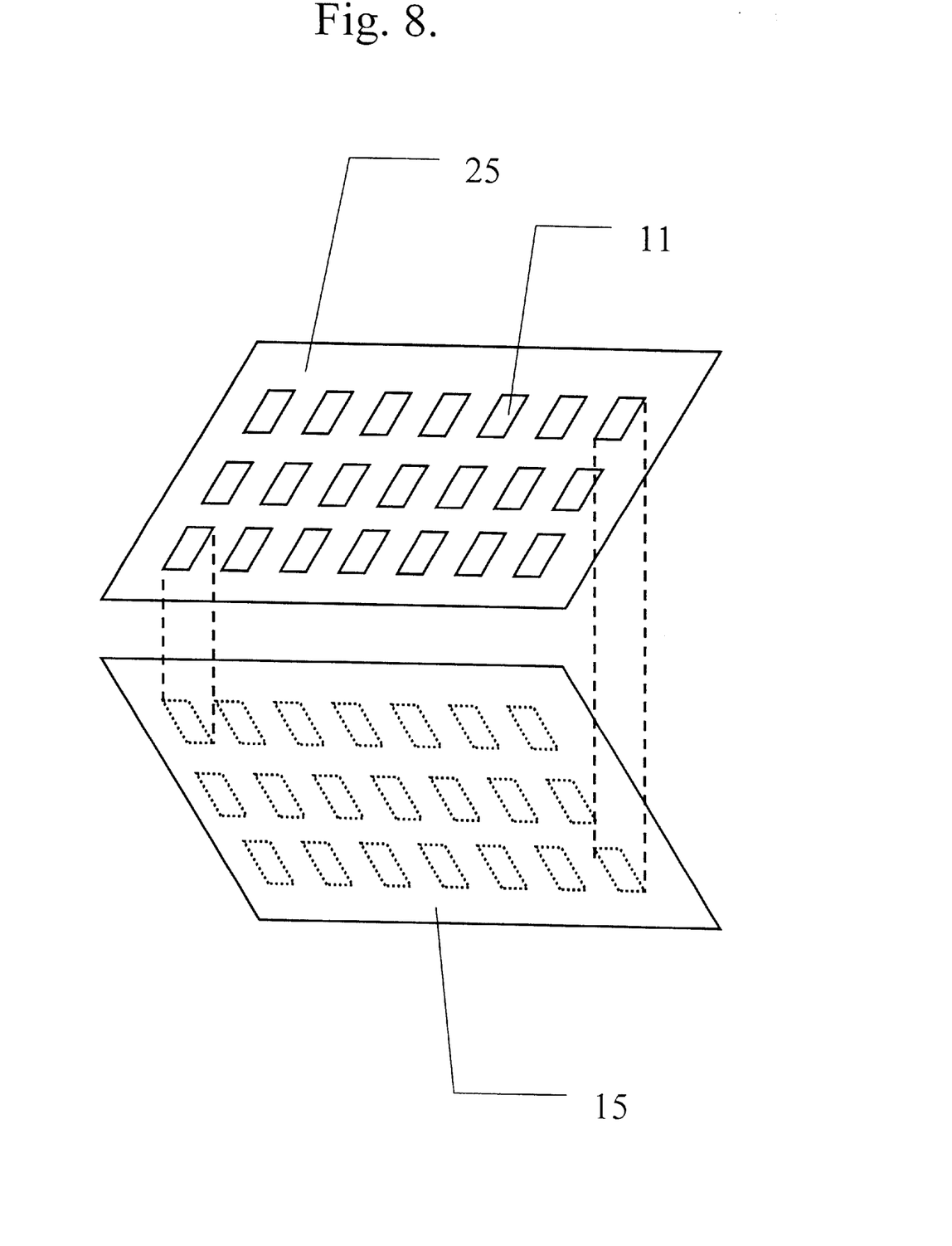
FIG. 8 shows a second embodiment of the present invention using a transfer unit.
Figure 9:
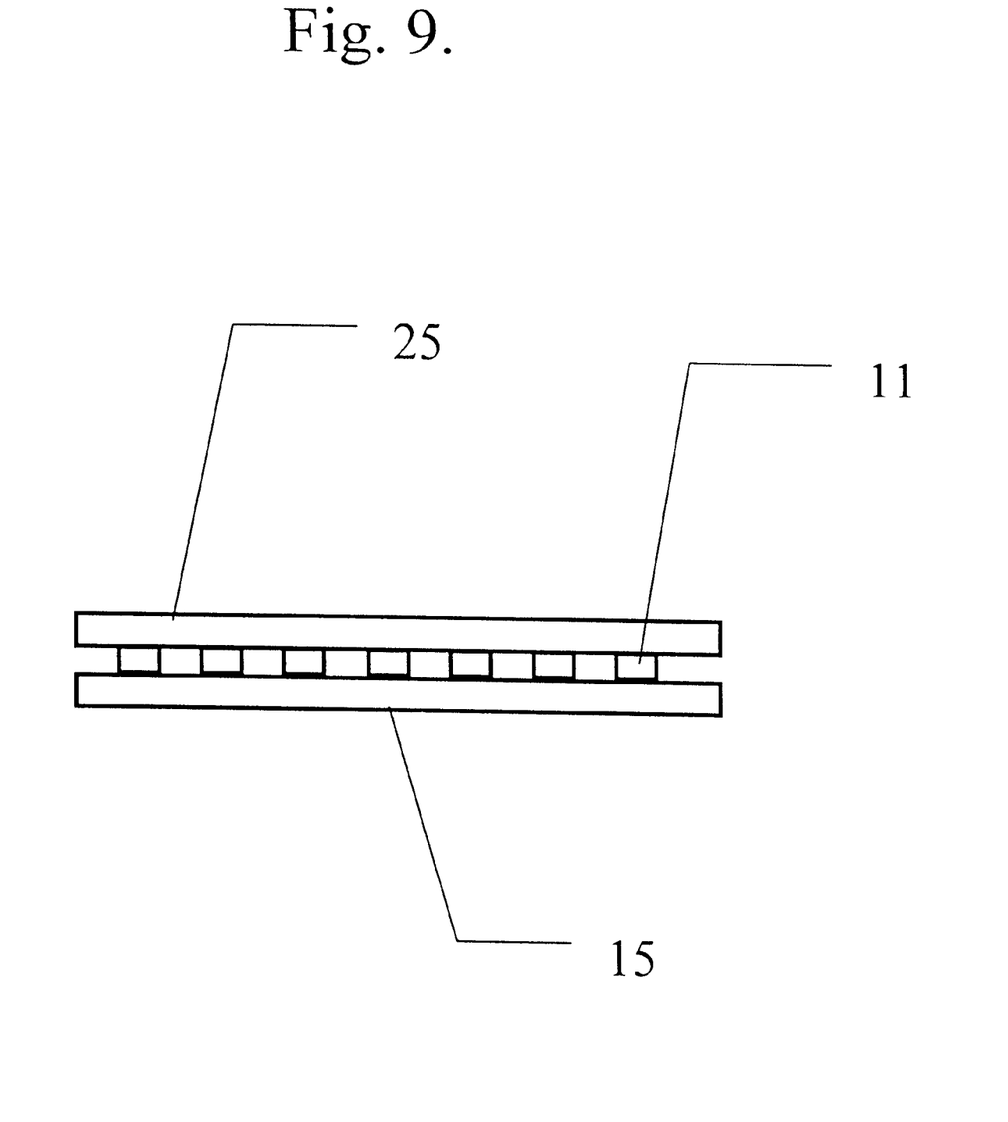
FIG. 9 shows the transfer of the dice of FIG. 8.
Figure 10:
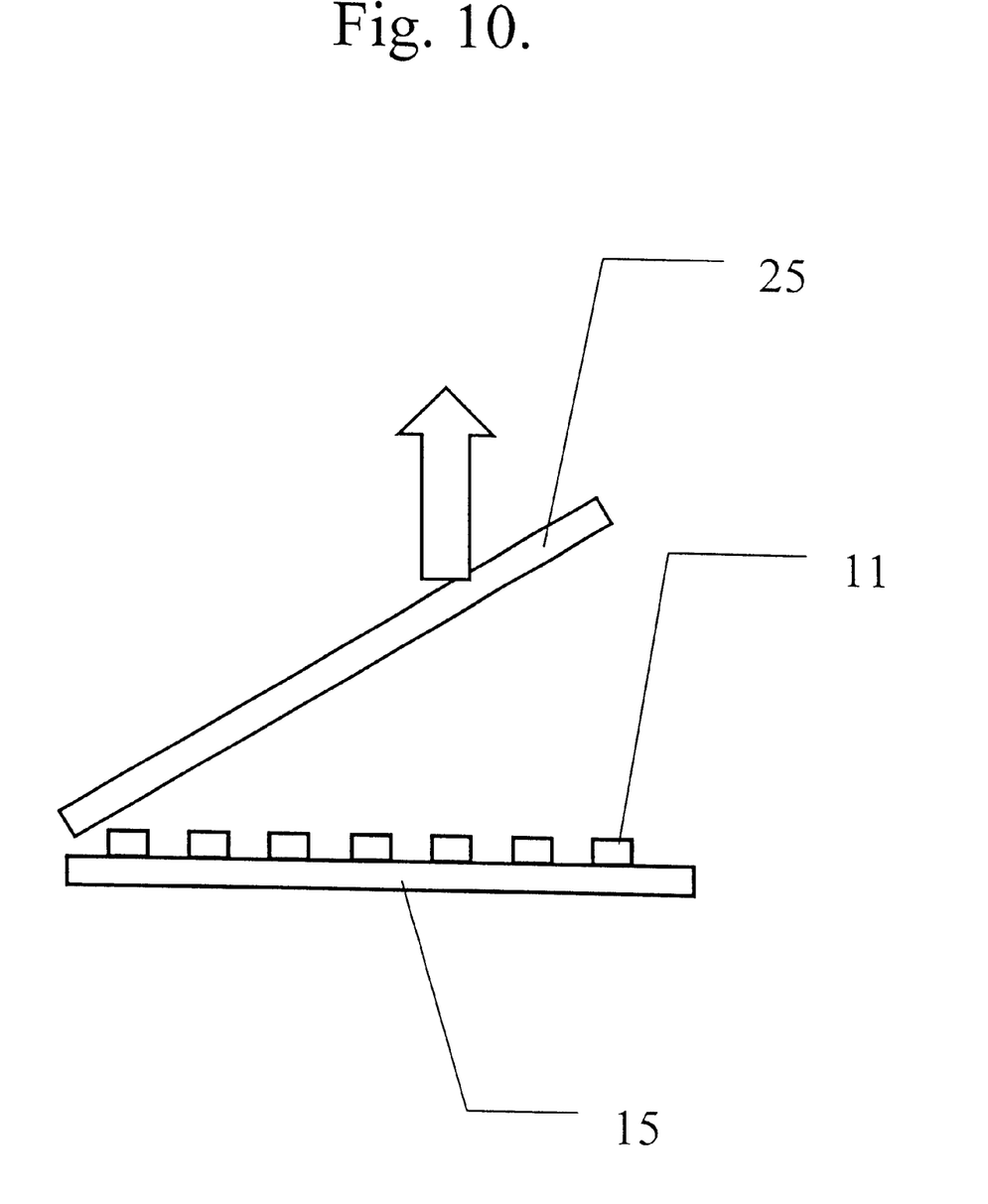
FIG. 10 shows the compressing of the dice onto the target unit for the second embodiment.

FIG. 8 shows another embodiment of the present invention. The dice 11 on the stretchable cloth 12 are first transferred to a sticky transfer unit 25 using the X-Y motions as in FIG. 6. The dice 11 on the bottom surface of the transfer unit 25 are pressed against the target unit 15. After compression, the structure is shown in FIG. 9. Afterwards, the structure is heated so that the dice 11 are adhered to the target unit 15. After the heating process, the transfer unit 25 is lifted upward as shown by the arrowhead to separate from the target unit 15.

Figure 11:
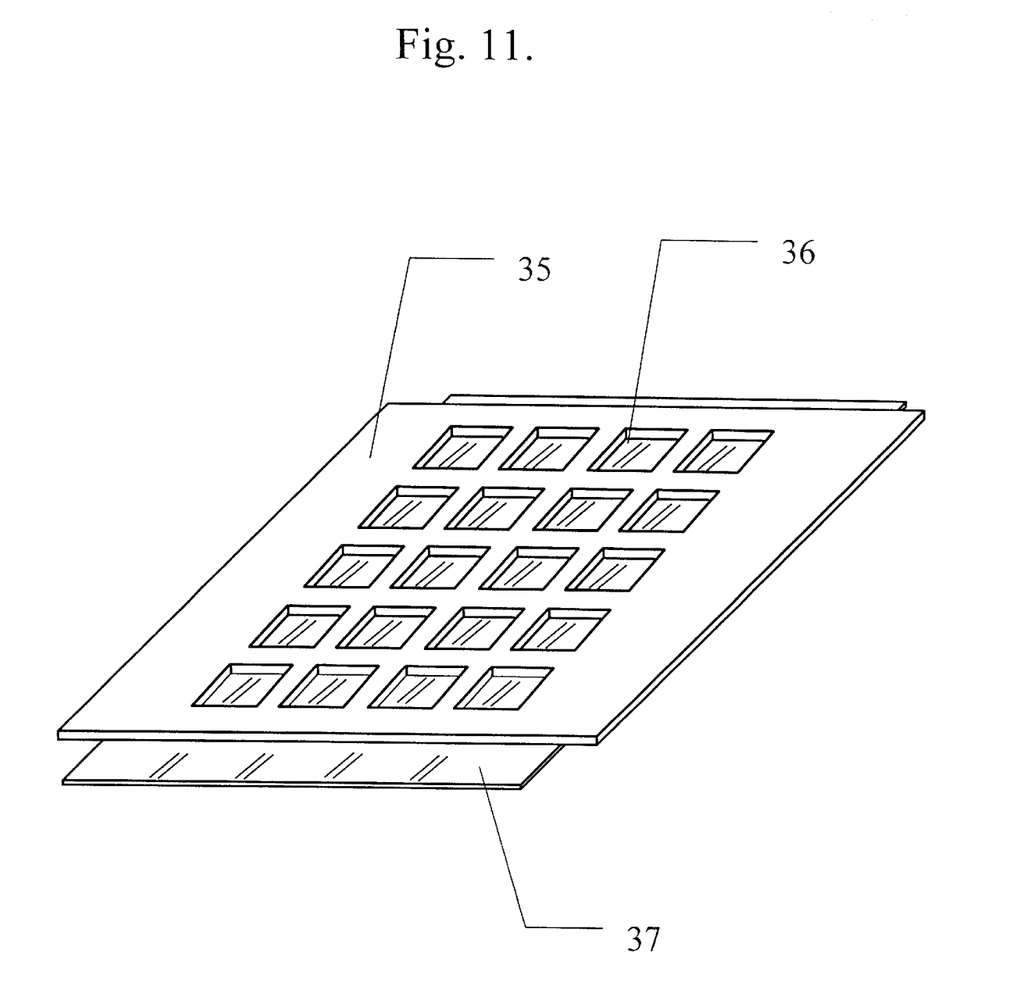
FIG. 11 shows a third embodiment of the present invention using a perforated transfer unit.

FIG. 11 shows a third embodiment of the present invention. In this embodiment, the transfer unit 35 has a matrix of windows 36 with a support plate 37.

Figure 12:
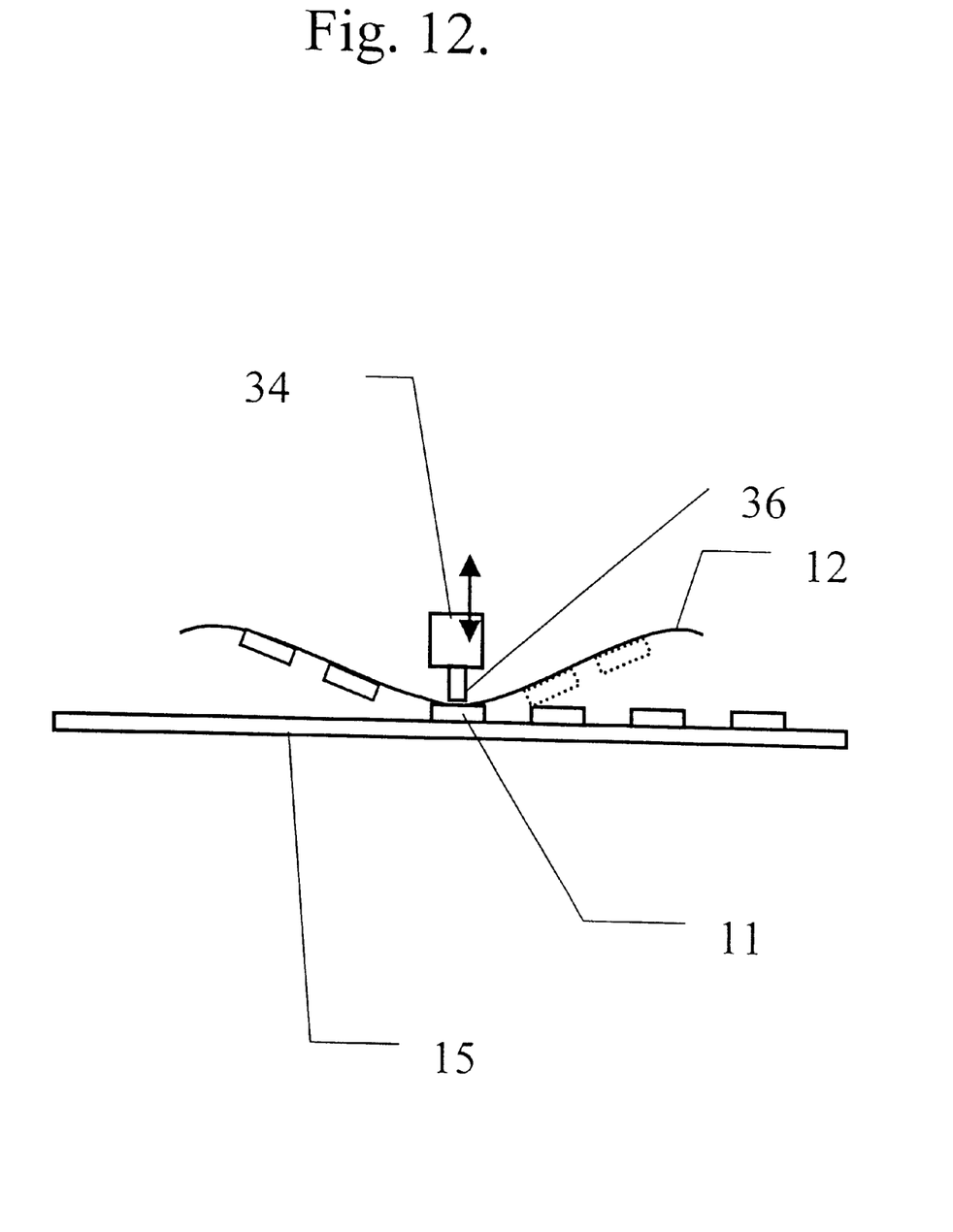
FIG. 12 shows a fourth embodiment of the present invention using a vertical hammer to transfer the dice.

FIG. 12 shows a fourth embodiment of the present invention. The mechanism is similar to that in FIG. 6 except that the hammer 34 is a vertical weight with a pinhead 36. Not using a lever to lower the hammer as in FIG. 6, the vertical hammer occupies a smaller space to press the dice 11 onto the target unit 15.

Figure 13:
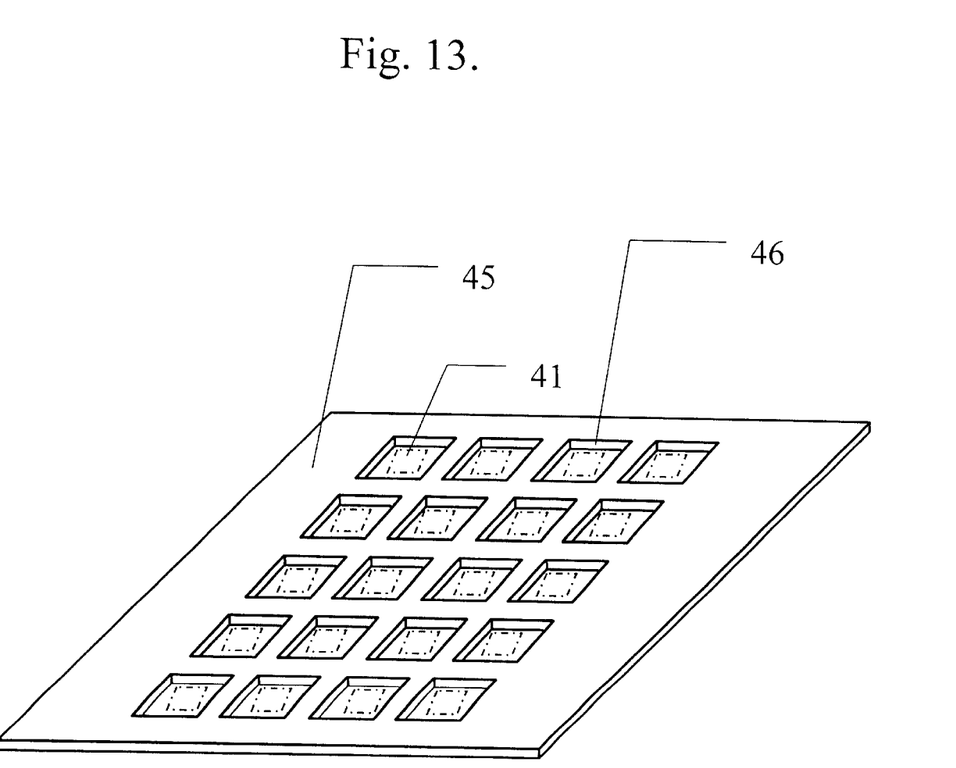
FIG. 13 shows a fifth embodiment of the present invention using cups transfer unit.
Figure 14:
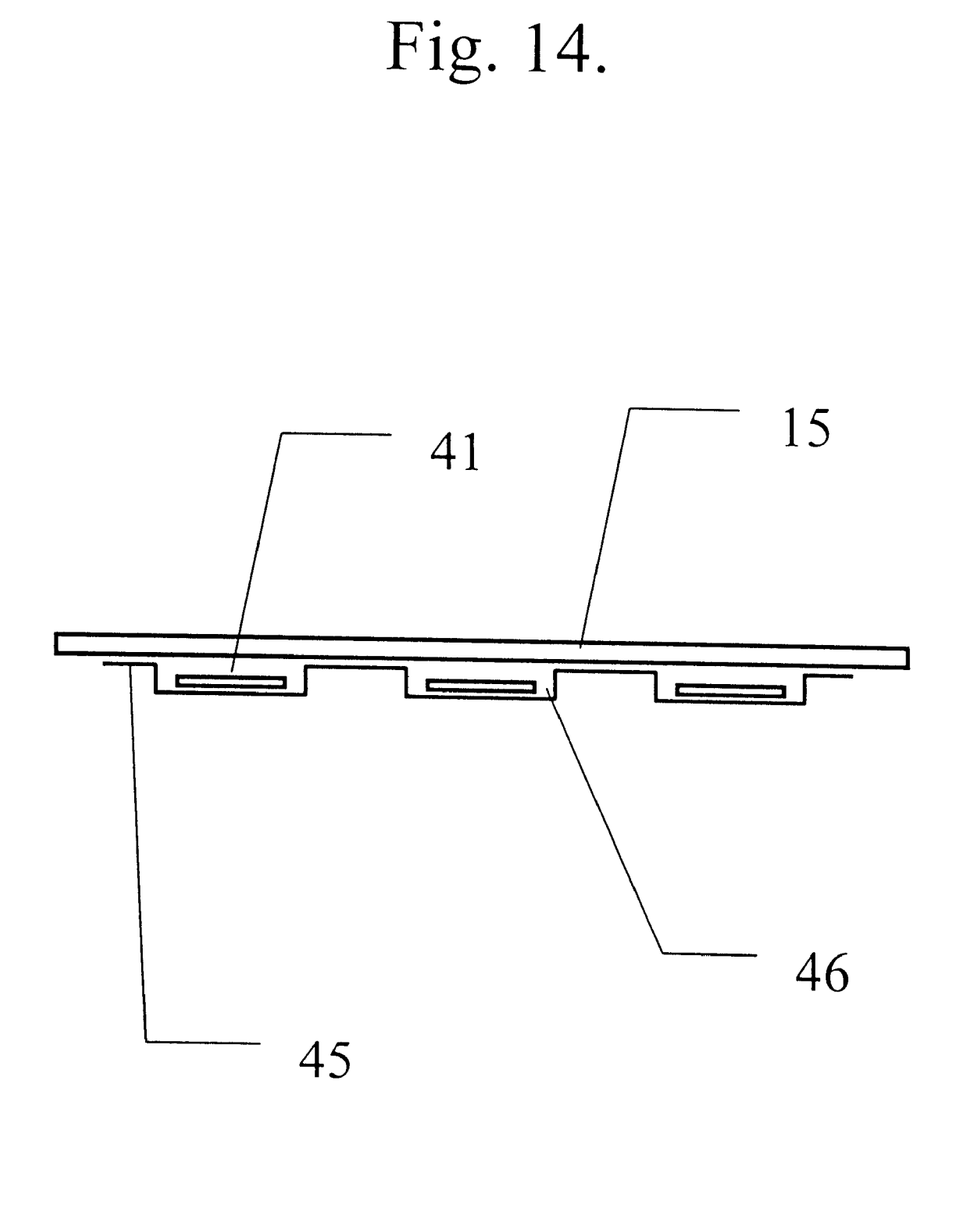
FIG. 14 shows the side view of FIG. 13 with a target unit over it.
Figure 15:
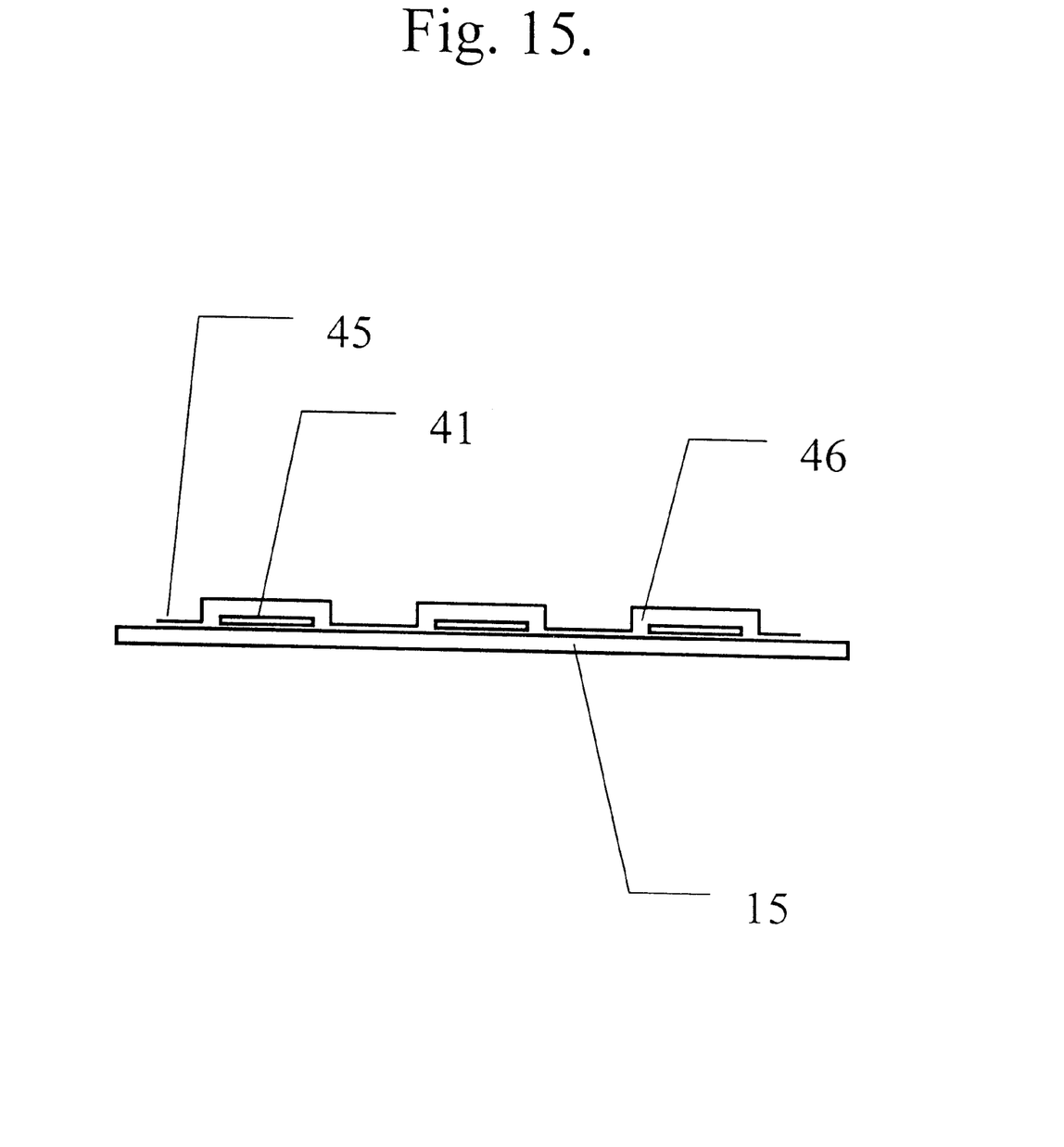
FIG. 15 shows the final structure of FIG. 13 after the dice are soldered to the target unit.

FIG. 13 shows a fifth embodiment of the present invention. The transfer unit 45 has a matrix of cups 46. The dice from the stretchable cloth are dropped into the cups as individual die 41. These cups correspond to the matrix of the motherboard. The transfer unit 45 is placed under the stretchable cloth 12 to receive the dropped dice. The bottom of the cup does not have any glue. The transfer unit 45, which is coated with solder pads at the surface facing the dice, is then covered with the target unit 15 as shown in FIG. 15. When the structure is flipped over and heat is applied, the dice 41 are soldered to the target unit 15. Since an optical die usually has very few bonding pads (typically two), it is accurate enough to align the bonding pads of the die to the soldering pads of the target unit 15.

While the preferred embodiments of the invention have been described, it will apparent to those skilled in the art that various modifications may be made in the embodiments without departing from the spirit of the present invention. Such modifications are all within the scope of this invention.

What is claimed is:

1. A method of transferring semiconductor dice from a scribed wafer to a target unit, comprising the steps of:

placing a scribed semiconductor wafer over a stretchable cloth;

stretching said stretchable cloth to separate said semiconductor wafer into a plurality of dice;

aligning a die of said plurality of dice against a target unit; and pressing the dice from the stretchable cloth to a target unit in a matrix formation.

2. A method of transferring semiconductor dice as described in claim 1, wherein said step of aligning is to move the stretchable cloth in orthogonal directions and to move the target unit in orthogonal directions.

3. A method of transferring semiconductor dice as described in claim 2, wherein said stretchable cloth is moved to a position where there is a die.

4. A method of transferring semiconductor dice as described in claim 2, wherein said stretchable cloth is moved to a position where a die forms a part of said matrix.

5. A method of transferring semiconductor dice as described in claim 1, wherein said step of transferring is to hammer said die against said target unit.

6. A method of transferring semiconductor dice as described in claim 5, wherein said step of transferring is to hammer from a lever.

7. A method of transferring semiconductor dice as described in claim 5, wherein said step of transferring is to hammer vertically.

8. A method of transferring semiconductor dice as described in claim 1, further comprising the step of transferring the die from said stretchable cloth to a transfer unit before transferring said die to said target unit.

9. A method of transferring semiconductor dice as described in claim 8, wherein said transfer unit is a sticky plate, which adheres to the dice and presses against the target unit 10.

10. A method of transferring semiconductor dice as described in claim 9, wherein transfer unit lets the target unit be soldered to the dice upon heating.

11. A method of transferring semiconductor dice as described in claim 9, wherein said transfer unit has cups for said dice to drop in.

12. A method of transferring semiconductor dice as described in claim 11, wherein said target unit has plated bonding pads, which mate with and is soldered to the bonding pads of the die upon heating.

* * * * *